(12) United States Patent
Pelissier

(10) Patent No.: US 10,854,487 B2
(45) Date of Patent: Dec. 1, 2020

(54) METHOD FOR THE TRANSPORTATION AND STORAGE OF A SEMICONDUCTOR PLATE IN A HERMETIC CONTAINER

(71) Applicants: Centre national de la recherche scientifique, Paris (FR); UNIVERSITE GRENOBLE ALPES, Saint Martin d'Heres (FR)

(72) Inventor: Bernard Pelissier, Echirolles (FR)

(73) Assignees: CENTRE NATIONAL DE LA RECHERCHE SCIENTIFIQUE, Paris (FR); UNIVERSITE GRENOBLE ALPES, Saint Martin d'Heres (FR)

(*) Notice: Subject to any disclaimer, the term of this patent is extended or adjusted under 35 U.S.C. 154(b) by 0 days.

(21) Appl. No.: 16/330,989

(22) PCT Filed: Sep. 5, 2017

(86) PCT No.: PCT/FR2017/052340
§ 371 (c)(1),
(2) Date: Mar. 6, 2019

(87) PCT Pub. No.: WO2018/046831
PCT Pub. Date: Mar. 15, 2018

(65) Prior Publication Data
US 2019/0259644 A1    Aug. 22, 2019

(30) Foreign Application Priority Data
Sep. 7, 2016    (FR) ...................................... 16 58300

(51) Int. Cl.
*H01L 21/673* (2006.01)
*H01L 21/677* (2006.01)

(52) U.S. Cl.
CPC .. *H01L 21/67393* (2013.01); *H01L 21/67379* (2013.01); *H01L 21/67389* (2013.01); *H01L 21/67769* (2013.01)

(58) Field of Classification Search
None
See application file for complete search history.

(56) References Cited

U.S. PATENT DOCUMENTS 7,418,982 B2 * 9/2008 Yu ..................... H01L 21/67376
141/63
2007/0059129 A1    3/2007 Hugler

FOREIGN PATENT DOCUMENTS

JP    2008202114    9/2008

OTHER PUBLICATIONS

Machine translation of JP 2008202114 from espacenet. (Year: 2008).*
International Search Report for PCT/FR2017/052340, dated Dec. 18, 2017.
Written Opinion of the International Searching Authority for PCT/FR2017/052340, dated Dec. 18, 2017.

* cited by examiner

*Primary Examiner* — Mark C Hageman
(74) *Attorney, Agent, or Firm* — B. Aaron Schulman, Esq.; Stites & Harbison, PLLC

(57) ABSTRACT

The invention relates to a method for the transportation and/or storage of at least one semiconductor plate, in which the plate is disposed in a hermetic container (1) filled with hydrogen at a pressure of between $10^{-1}$ and $4*10^3$ Pa and, optionally, at least one inert gas, the total pressure in the casing being between $10^{-1}$ and $5*10^4$ Pa.

7 Claims, 1 Drawing Sheet

METHOD FOR THE TRANSPORTATION AND STORAGE OF A SEMICONDUCTOR PLATE IN A HERMETIC CONTAINER

The present patent application claims the priority of the French patent application FR16/58300 which will be considered as an integral part of the present description.

FIELD

The present application relates to a method for the transportation and/or storage of a semiconductor plate in a hermetic container.

PRESENTATION OF THE PRIOR ART

The manufacture of microelectronic components on a semiconductor plate comprises many steps that are implemented by various pieces of equipment. Between two successive manufacturing steps, the semiconductor plate is transported from one piece of equipment to another, and may be stored for a period ranging from a few hours to several days. In fact, the equipment may be located in the same place, or in other places, possibly on different continents.

It has been proposed to transport and store semiconductor plates in hermetic boxes in order to avoid any contamination or oxidation of these plates. To do this, a box is hermetically coupled to a device in which there is a plate to be transported, via an interface or I/O lock. The plate is then moved from the inside of the piece of equipment into the box via the interface. The box is then closed tightly and decoupled from the interface in order to be transported to the next piece of equipment where the plate is transferred from the box to the piece of equipment.

To limit oxidation of the semiconductor plate, the box may be filled with a neutral gas at ambient pressure. However, in practice, it is very difficult to have a 100% pure neutral gas. On the other hand, after certain steps have been performed under vacuum or under low pressure, the surface of the semiconductor plate may be sensitive to an increase in pressure up to atmospheric pressure. As a result, changes to the surface of the plate by adsorption, desorption, and/or physisorption phenomena are still likely to occur.

To overcome the problems resulting from the availability of a pure neutral gas, a vacuum may be established in the box. Nevertheless, once the vacuum is established, degassing may occur from the inner walls of the box and its cover or door. In particular, in the case where the box or the seals used to ensure the hermeticity of the box are made of polymers, the latter are liable to degas carbon compounds inside the box. It is therefore necessary to maintain the pumping of the gases present in the box after its closure, and preferably to maintain an ultra-high vacuum, i.e. a pressure in the box of less than $10^{-9}$ mbar ($10^{-7}$ Pa). Maintaining such pumping after closing the box requires the use of equipment that is not really suitable for the transportation of the box. In addition, the use of ultrahigh vacuum requires the use of expensive technologies that are difficult to implement, such as metal boxes and/or joints, for example stainless steel boxes and copper joints.

SUMMARY

One embodiment provides a method for transporting and/or storing semiconductor plates in a hermetic container that overcomes at least some of the drawbacks of the various methods mentioned above.

One embodiment provides a method for transporting and/or storing at least one semiconductor plate, wherein the plate is arranged in a hermetic container filled with hydrogen at a pressure of between $10^{-1}$ and $4*10^3$ Pa and optionally at least one neutral gas, wherein the total pressure in the container is between $10^{-1}$ and $5*10^4$ Pa.

According to one embodiment, the method comprises the following steps:
 hermetically coupling the container to an input/output interface of a piece of equipment,
 moving the semiconductor plate from the inside of the piece of equipment into the container via the interface,
 filling the container with hydrogen and optionally the at least one neutral gas, and
 closing the container hermetically and decoupling it from the interface.

According to one embodiment, the container is filled with hydrogen and the at least one neutral gas, wherein the hydrogen pressure is between 10 and $4*10^3$ Pa and the total pressure is between 10 and $10^4$ Pa.

According to one embodiment, the at least one neutral gas is selected from the group comprising argon, nitrogen and helium.

According to one embodiment, the container is only filled with hydrogen at a pressure of between 10 and $4*10^3$ Pa.

One embodiment provides a hermetic container, for transporting and/or storing a semiconductor plate, filled with hydrogen at a pressure of between $10^{-1}$ and $4*10^3$ Pa and optionally at least one neutral gas, wherein the total pressure in the container is between $10^{-1}$ and $5*10^4$ Pa.

According to one embodiment, the container is filled with hydrogen and the at least one neutral gas, wherein the hydrogen pressure is between 10 and $4*10^3$ Pa and the total pressure is between 10 and $10^4$ Pa.

According to one embodiment, the at least one neutral gas is selected from the group comprising argon, nitrogen and helium.

According to one embodiment, the container is only filled with hydrogen at a pressure of between 10 and $4*10^3$ Pa.

According to one embodiment, the container is designed to be hermetically coupled to an input/output interface of a piece of equipment for semiconductor plates manufacture or characterization.

BRIEF DESCRIPTION OF THE DRAWINGS

These and other features and advantages will be set forth in detail in the following description of particular embodiments in a non-limiting manner in connection with the accompanying drawings, wherein.

DETAILED DESCRIPTION

The same elements have been designated by the same references in the various figures and, in addition, the various figures are not drawn to scale. For the sake of clarity, only the elements useful for understanding the described embodiments have been shown and detailed.

In the foregoing, in the following description and in the claims, unless otherwise stated, the term "substantially" is understood to mean within 10%, preferably within 5%. The term "neutral gas" is understood to mean gas that does not react with the surface of a semiconductor plate. The expression "pressure of a gas in a container" is understood to mean the total pressure in the container when it is only filled with this gas, or partial pressure of this gas in the container when it is filled with a mixture of gases. The term "hermetic" is understood to mean not letting fluids through.

Figure 1:
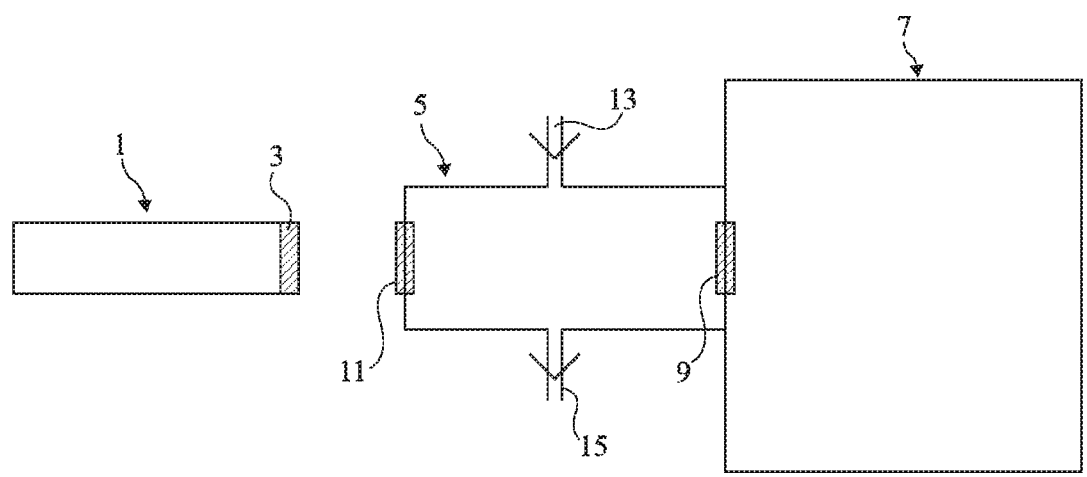
FIG. 1 diagrammatically illustrates an embodiment of a method for putting a semiconductor plate into a box, and an example of a device for carrying out this method.

FIG. 1 illustrates very schematically a device for putting a semiconductor plate into a container.

FIG. 1 illustrates a hermetic container or box 1 provided with a door 3 sealing the box. The box 1 may correspond to any type of box commonly used in microelectronic device manufacturing lines, for example a box of the Front Opening Universal Pod (FOUP) type, or the Standard Mechanical InterFace (SMIF) type. The box 1 is designed to be hermetically coupled to an interface or input/output lock of the piece of equipment 7 for manufacturing or characterizing semiconductor plates. The interface 5 comprises an opening towards the inside of the piece of equipment 7 that is hermetically closed by a door 9, and an opening towards the outside that is hermetically closed by a door 11. The interface 5 further comprises gas injection devices 13 and gas pumping devices 15. It is thus possible to safely transfer a plate from the box 1 to the piece of equipment and conversely without polluting or contaminating the plate, the inside of the box 1 or the piece of equipment 7. Once the plate is loaded in the box 1, we can choose the composition and pressure of the atmosphere in the box.

Although not described, the steps of purging, pressure equalization, door opening and closing, are performed in order to transfer a plate between the box 1 and the piece of equipment 7. Those skilled in the art will be able to adapt the order, the number and the manner to implement these steps, which depend on the type of box, the type of interface, and the type of equipment used.

It is proposed here, that when a plate is loaded into the box 1, the box is filled with hydrogen so that, when closed, the hydrogen pressure is less than 40 mbar ($4*10^3$ Pa), for example between 0.001 and 40 mbar ($10^{-1}$ and $4*10^3$ Pa), preferably between 0.1 and 40 mbar (10 and $4*10^3$ Pa). At least one neutral gas selected from the group consisting of argon, nitrogen and helium may be added to the hydrogen. The box 1 is then filled so that, upon its closure, the total pressure in the box is between 0.001 and 500 mbar ($10^{-1}$ and $5*10^4$ Pa), preferably between 0.1 and 100 mbar (10 and $10^4$ Pa). Thus, in this case, the total pressure in the box may be greater than 40 mbar ($4*10^3$ Pa), while maintaining a hydrogen partial pressure of less $4*10^3$ Pa). The addition of such a neutral gas is, for example, provided according to the step implemented in the piece of equipment 7 or in a following piece of equipment, in particular to adapt to the pressure inside the equipment.

As will be described in greater detail in connection with FIG. 2, tests have shown that when a semiconductor plate is put into a hermetic box under a controlled hydrogen atmosphere as proposed above, oxidation by oxygen and carbon contamination on the surface of this plate are limited. This is attributed to the reducing and passivating nature of hydrogen. These tests have also shown that hydrogen does not modify the surface structure of the semiconductor plate.

In a production line comprising several devices 7 equipped with their interfaces 5, the pressure in the equipment and their interfaces is most often lower than the ambient pressure. Since the total pressure in the box 1 is also lower than the ambient pressure and may be adapted to the pressure in the equipment, the pumping stresses are limited.

Advantageously, the total pressure in the box is within easy pressure ranges and is inexpensive to implement. In particular, for the pressure ranges indicated above, the box 1, the door 3 and the seals (not shown) that ensure the hermetic coupling of the box 1 with the door 3 or the interface 5, may be made of inexpensive polymers.

Hydrogen pressure in the box 1 of less than 40 mbar ($4*10^3$ Pa) makes it possible to overcome any risk of flammability of the hydrogen in the event of accidental opening or leakage of the box 1.

Figure 2:
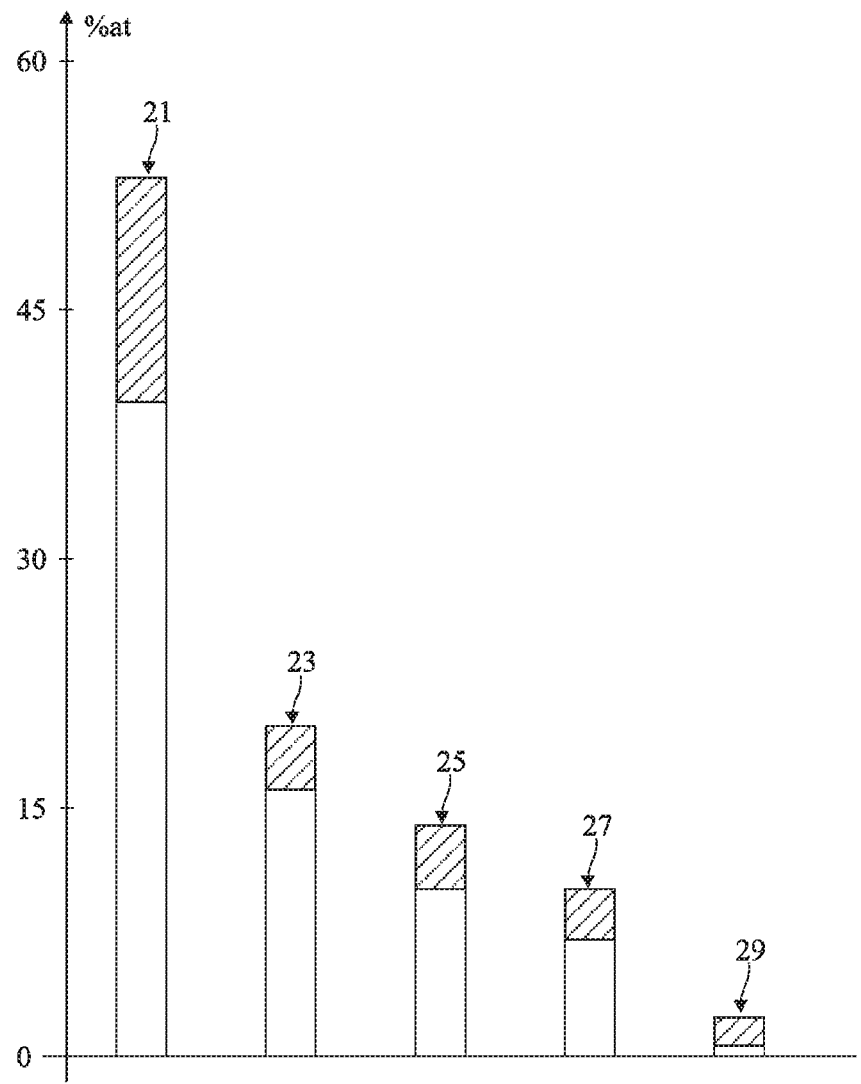
FIG. 2 illustrates levels of contamination of the surface of a semiconductor plate according to different storage conditions of this plate.

FIG. 2 illustrates the rate of contamination of the surface of a silicon plate after one hour of storage, under different conditions, in a sealed aluminum box with seals made of a polymer material. The contamination rate, in ordinate, is expressed in percentage of atoms (at %) of oxygen and carbon present on the surface of the plate and is represented by bars. In the case of each bar, the lower unshaded portion represents the carbon atom contamination, while the hatched upper portion represents the oxygen atom contamination.

The bars 21 and 23 correspond to the case where the plate is stored under dynamic vacuum, at pressures of $10^{-6}$ mbar ($10^{-4}$ Pa) and $10^{-7}$ mbar ($10^{-5}$ Pa), respectively.

The bar 25 corresponds to the case where the plate is stored under static vacuum at a pressure of $10^{-2}$ mbar (1 Pa).

The bar 27 corresponds to the case where the plate is stored in a box filled with a low-pressure neutral gas, in this case nitrogen at a pressure of 80 mbar ($8*10^3$ Pa).

The bar 29 corresponds to the case where the plate is stored in a box in a hydrogen-controlled atmosphere as has been proposed here.

As may be seen in FIG. 2, the storage of a semiconductor plate under controlled atmosphere in hydrogen (bar 29) makes it possible to reduce the contamination of the surface of the plate by carbon and oxygen atoms compared to the case of storage without hydrogen. More particularly, in the case of storage under a controlled atmosphere in hydrogen, the contamination in carbon atoms is less than 1.4 at %, the contamination in oxygen atoms is less than 0.6 at %, and the total contamination in oxygen and carbon atoms is less than 2 at %. Thus, the contamination in carbon atoms is at least ten times lower, the contamination in oxygen atoms is at least two times lower, and the total contamination of oxygen and carbon atoms is at least five times lower in the case of controlled hydrogen storage compared to the case of hydrogen-free storage.

Particular embodiments have been described.

Variations and modifications will become apparent to those skilled in the art. In particular, several semiconductor plates may be transported or stored in the same hermetic box or container, under a controlled atmosphere of hydrogen as proposed here.

Injection and gas pumping devices may be periodically coupled to the box in order to maintain a controlled hydrogen atmosphere in the box once this one has been decoupled from any input/output interface of a piece of equipment, for example in the case of long storage and/or transport stages spanning several days.

The invention claimed is:

1. A method of transporting and/or storing at least one semiconductor plate, comprising:
providing a hermetic container for transporting and/or storing the at least one semiconductor plate, wherein said hermetic container has at least one door and is configured to be coupled to and/or decoupled from an input/output interface of a piece of equipment containing the at least one semiconductor plate;

filling the hermetic container with hydrogen at a pressure of between $10^{-1}$ and $4*10^3$ Pa, hermetically coupling the hermetic container to said input/output interface of said piece of equipment, moving the at least one semiconductor plate from the inside of the piece of equipment into the hermetic container via the input/output interface, hermetically sealing the hermetic container;

uncoupling said hermetic container from the input/output interface of said piece of equipment; and moving said hermetic container away from said piece of equipment, wherein the total pressure in the hermetic container is between $10^{-1}$ and $5*10^4$ Pa.

2. The method according to claim 1, wherein the hermetic container is further filled with at least one neutral gas.

3. The method according to claim 2, wherein the total pressure is between 10 to $10^4$ Pa.

4. The method according to claim 2, wherein the at least one neutral gas is selected from the group consisting of argon, nitrogen, and helium.

5. The method according to claim 1 wherein the hydrogen is pure hydrogen.

6. The method according to claim 1 wherein the piece of equipment is a device for manufacturing semiconductor plates.

7. The method according to claim 1 wherein the input/output interface further comprises a device selected from the group consisting of a gas injection device and a gas pumping device.

* * * * *